(12) United States Patent
Fujikura et al.

(10) Patent No.: US 9,105,755 B2
(45) Date of Patent: Aug. 11, 2015

(54) METHOD OF MANUFACTURING A NITRIDE SEMICONDUCTOR EPITAXIAL SUBSTRATE

(75) Inventors: Hajime Fujikura, Mito (JP); Taichiroo Konno, Hitachi (JP); Michiko Matsuda, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 13/524,300

(22) Filed: Jun. 15, 2012

(65) Prior Publication Data

US 2013/0001644 A1 Jan. 3, 2013

(30) Foreign Application Priority Data

Jul. 1, 2011 (JP) ................................. 2011-146935

(51) Int. Cl.
| | | |
|---|---|---|
| H01L 21/02 | (2006.01) | |
| H01L 29/872 | (2006.01) | |
| H01L 29/66 | (2006.01) | |
| H01L 33/00 | (2010.01) | |
| H01L 33/12 | (2010.01) | |
| H01L 33/32 | (2010.01) | |
| H01L 29/20 | (2006.01) | |

(52) U.S. Cl.
CPC .......... *H01L 29/872* (2013.01); *H01L 21/0237* (2013.01); *H01L 21/0242* (2013.01); *H01L 21/0254* (2013.01); *H01L 21/0262* (2013.01); *H01L 21/02433* (2013.01); *H01L 21/02458* (2013.01); *H01L 29/66212* (2013.01); *H01L 29/2003* (2013.01); *H01L 33/007* (2013.01); *H01L 33/12* (2013.01); *H01L 33/32* (2013.01)

(58) Field of Classification Search
CPC ..................... H01L 21/0254; H01L 21/02389; H01L 21/02433; H01L 21/02609; C30B 29/403
USPC .......................................................... 257/190
See application file for complete search history.

(56) References Cited

U.S. PATENT DOCUMENTS

| 6,649,493 | B2 | 11/2003 | Asai | |
|---|---|---|---|---|
| 7,998,847 | B2 | 8/2011 | Hirota et al. | |
| 8,310,030 | B2 | 11/2012 | Hirota et al. | |
| 2009/0315150 | A1* | 12/2009 | Hirota et al. | 257/615 |
| 2011/0049573 | A1* | 3/2011 | Hashimoto et al. | 257/201 |

(Continued)

FOREIGN PATENT DOCUMENTS

| JP | 2002-222771 | 8/2002 |
|---|---|---|
| JP | 2008195597 | 8/2008 |

(Continued)

OTHER PUBLICATIONS

Cho et al., "Influence of Mg doping on structural defects in AlGaN layers grown by metalorganic chemical vapor deposition", Applied Physics Letters 79, 3788 (2001), AIP Publishing.*

(Continued)

*Primary Examiner* — Andy Huynh
*Assistant Examiner* — Sitaramarao S Yechuri
(74) *Attorney, Agent, or Firm* — Paul D. Bianco; Martin Fleit; Fleit Gibbons Gutman Bongini & Bianco PL

(57) ABSTRACT

There is provided a nitride semiconductor epitaxial substrate having a group III nitride semiconductor layer with C-plane as a surface, grown on a substrate via a buffer layer of the group III nitride semiconductor containing Al, wherein the buffer layer has an inversion domain on the surface.

4 Claims, 3 Drawing Sheets

(56) References Cited

U.S. PATENT DOCUMENTS

2011/0073873 A1* 3/2011 Kikkawa et al. ............... 257/77
2011/0259261 A1 10/2011 Iwai et al.
2011/0260295 A1 10/2011 Hirota et al.

FOREIGN PATENT DOCUMENTS

| JP | 2009137771 | 6/2009 |
| JP | 2010064947 | 3/2010 |
| WO | 2010079655 | 7/2010 |

OTHER PUBLICATIONS

Jasinski et al., "Inversion domains in AlN grown on (0001) sapphire", Appl. Phys. Lett. 83, 2811 (2003).*

Japanese Decision of Refusal dated Jan. 27, 2015 for Japanese Application No. 2011-146935.

G. K. Kishore and others, Growth of Al$_x$Ga$_{(1-x)}$N, In$_y$Ga$_{(1-y)}$N Single Crystal Using a Na flux method, Collection of papers of the Institute of Electronics, Information and Communication Engineers, Mar. 7, 2001, 2001 Electronics 2, p. 31.

* cited by examiner

METHOD OF MANUFACTURING A NITRIDE SEMICONDUCTOR EPITAXIAL SUBSTRATE

The present application is based on Japanese Patent Application No. 2011-146935, filed on Jul. 1, 2011, the entire contents of which are hereby incorporated by reference.

BACKGROUND OF THE INVENTION

1. Technical Field

The present invention relates to a nitride semiconductor epitaxial substrate having a buffer layer of a group III nitride semiconductor containing Al and a nitride semiconductor device using the same.

2. Description of the Related Art

A technique of reducing dislocation of a group III nitride semiconductor layer is known, wherein a low temperature buffer layer such as AlN and GaN or a high temperature buffer layer such as AlN and AlGaN is provided between a heterogeneous substrate and the group III nitride semiconductor substrate, in a case that a nitride semiconductor epitaxial substrate with the group III nitride semiconductor layer such as GaN, etc., grown thereon, is fabricated on the heterogeneous substrate such as a sapphire substrate and a SiC substrate.

As a proposal regarding the high temperature buffer layer, patent document 1 describes a technique of reducing the dislocation in the group III nitride film formed on the AlN buffer layer by forming unevenness on a surface of the AlN buffer layer (base film).

Patent document 1:
Japanese Patent Laid Open Publication No. 2002-222771

SUMMARY OF THE INVENTION

However, in the aforementioned conventional method of providing the lower temperature buffer layer or the high temperature buffer layer such as AlN, the dislocation in the group III nitride semiconductor layer can't be sufficiently reduced, and a crack is frequently generated on the group III nitride semiconductor layer. Particularly, in a case that a thickness of the group III nitride semiconductor layer such as GaN layer, etc., is 5 µm or more, an epitaxial substrate with cracks generated thereon is rapidly increased, thus largely deteriorating a yield rate.

An object of the present invention is to provide a nitride semiconductor epitaxial substrate having a group III nitride semiconductor layer capable of reducing dislocation and capable of suppressing a generation of cracks, and a nitride semiconductor device.

According to an aspect of the present invention, there is provided a nitride semiconductor epitaxial substrate having a Group III nitride semiconductor layer with C-plane as a surface, grown on a substrate via a buffer layer of the Group III nitride semiconductor containing Al, wherein the buffer layer has an inversion domain on the surface.

According to other aspect of the present invention, there is provided a nitride semiconductor device having a device structure formed on the nitride semiconductor epitaxial substrate.

DETAILED DESCRIPTION OF THE INVENTION

Embodiments of a nitride semiconductor epitaxial substrate and a nitride semiconductor device according to the present invention will be descried hereafter.

(Nitride Semiconductor Epitaxial Substrate)

Figure 1A:
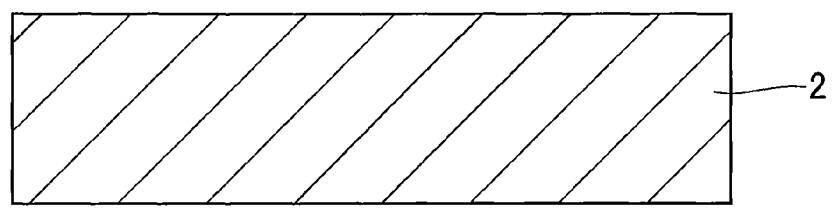
FIG. 1A to FIG. 1C are cross-sectional views showing respectively the manufacturing steps of manufacturing a nitride semiconductor epitaxial substrate according to an embodiment of the present invention.
Figure 1B:
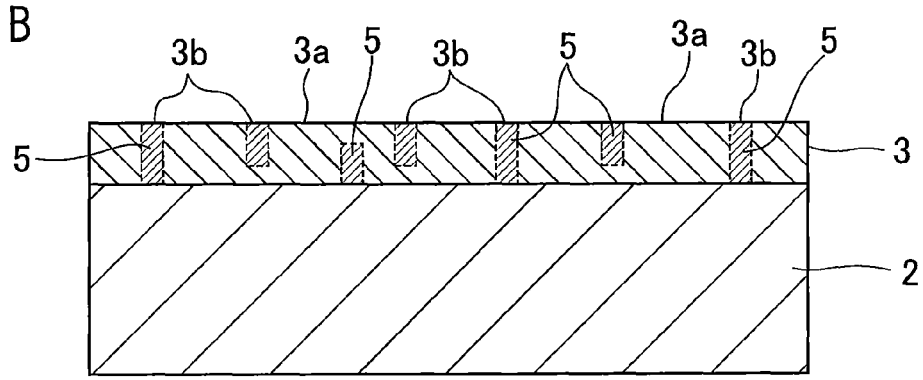
Figure 1C:
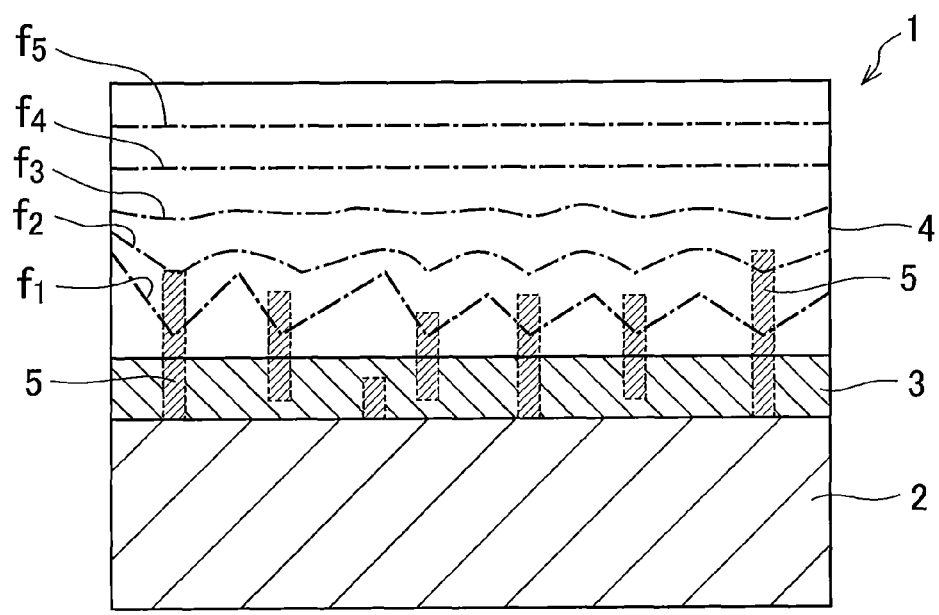

FIG. 1A to FIG. 1C are cross-sectional views showing the manufacturing steps of manufacturing a nitride semiconductor epitaxial substrate according to an embodiment of the present invention, respectively. The nitride semiconductor epitaxial substrate of this embodiment will be described using FIG. 1A to FIG. 1C showing the manufacturing steps.

FIG. 1C shows a nitride semiconductor epitaxial substrate 1 to be manufactured. The nitride semiconductor epitaxial substrate 1 is formed by epitaxially-growing a group III nitride semiconductor layer 4 such as GaN (gallium nitride) on a substrate 2 for growing nitride semiconductor, via a buffer layer 3 of the group III nitride semiconductor containing Al (aluminum), wherein the buffer layer 3 has an inversion domain (ID) 5 on its surface. Wherein, the inversion domain (ID) refers to an area in reverse polarity in comparison with circumferential crystals, and refers to an area in which an area having N-polarity in reverse polarity or N-polar face is generated in group III nitride semiconductor crystal (in group III polarity such as Ga-polarity and Al-polarity).

First, as shown in FIG. 1A, a substrate 2, being the substrate for growing the group III nitride semiconductor is prepared. Each kind of substrate suitable for epitaxially-growing the group III nitride semiconductor such as sapphire substrate, ZnO substrate, SiC substrate, Si substrate, GaAs substrate, GaN substrate, AlN substrate, and AlGaN substrate, can be used for the substrate 2.

Further, the surface of each kind of substrate may be used as the surfaces of these substrates, if it is suitable for a growth, with a group III surface of C-plane of the group III nitride semiconductor as the surface. For example, in the sapphire substrate without polarity, the C-plane may be used, or the surface inclined by 0 to 2° in a direction from the C-plane to A-axis, M-axis or an intermediate direction of them may be used. Further, in the ZnO substrate, Zn-plane of the C-plane may be used, and in the SiC substrate, Si-plane of the C-plane may be used, and in the GaN substrate, the AlN substrate, and the AlGaN substrate, the group III plane of the C-plane may be used, or the surface inclined by 0 to 2° in a direction from the C-plane to A-axis, M-axis or an intermediate direction of them may be used. In the Si substrate, (111) plane may be used, and in the GaAs substrate, (111)A plane or (111)B plane may be used and the surface inclined by 0 to 2° in an arbitrary direction from these planes may be used.

Next, as shown in FIG. 1B, the buffer layer 3 of the group III nitride semiconductor (such as AlN, AlGaN) containing Al, is formed on the substrate 2 by a vapor phase epitaxial method. HVPE method (Hydride Vapor Phase Epitaxial) and MOVPE method (Metal Organic Vapor Phase Epitaxial), etc., are used as the vapor phase epitaxial method.

When the buffer layer 3 containing large quantity of Al is grown on the substrate 2 at a high temperature of 900° C. or more, the buffer layer 3 is grown using the group III plane as the surface, because Al plane of the AlN crystal is extremely stable compared with N plane, thus not generating N-group polar region (ID) on the surface of the buffer layer 3.

In this embodiment, by adding impurities into the buffer layer 3 of AlN, etc., to thereby generate and introduce ID on the buffer layer 3 of AlN, etc., which continues to grow without being embedded in the group III polar layer, so that there is ID that reaches the surface of the buffer layer 3. It can be considered that stress in the buffer layer 3 is increased by increasing a concentration of the impurities added into the buffer layer 3 of AlN, etc., and therefore ID is introduced to relax the stress, and ID becomes stable by presence of the stress, thus continuing the presence of ID without disappearing.

As the impurities in the buffer layer 3, one kind or two kinds of Cl (chlorine), S (sulfur), and B (boron) are contained, with a concentration of $1 \times 10^{15}$ cm$^{-3}$ or more and $1 \times 10^{19}$ cm$^{-3}$ or less. Thus, although depending on the kind of the added impurities, the surface density (number density) of the ID on the surface of the buffer layer 3 can be adjusted in a range of approximately $1 \times 10^4$ cm$^{-2}$ or more and $1 \times 10^{11}$ cm$^{-2}$ or less.

As shown in FIG. 1B, ID5 exists on the surface of the buffer layer 3, and N-polar face 3b of ID5 appears in the group III polar face (Al polar face in a case of the AlN buffer layer) 3a with a prescribed surface density, on the surface of the buffer layer 3.

In a case of the HVPE method performed in the vapor phase epitaxial of the buffer layer 3, for example, the pressure is set to 500 Torr (about 66661 Pa) to 760 Torr (about 101325 Pa, normal pressure), and V/III ratio is set to 10 or less, and a growth temperature is set to 900° C. to 1200° C. Further, in a case of the MOVPE method for example, the pressure is set to 500 Torr or less, V/III ratio is set to 10 or less, the growth temperature is set to 900° C. to 1200° C. Further, as a source gas, for example, NH$_3$ is used for N-source, AlCl$_3$ is used for Al-source, GaCl is used for Ga-source, InCl is used for In-source, and as impurity gas of Cl, S, B, HCl, H$_2$S BCl$_3$ are used respectively. Further, in a case of the MOVPE method, as the source gas, for example, NH$_3$ is used for the N-source, TMA (trimethyl aluminum) is used for the Al-source, TMG (trimethyl gallium) is used for the Ga-source, TMI (trimethyl indium) is used for the In-source, and as the impurity gas of Cl, S, B, HCl H$_2$S, B$_2$H$_6$ are respectively used. Further, H$_2$ or N$_2$ is used for the carrier gas in either case of the HVPE method and the MOVPE method.

The growth speed is set to 5 to 100 nm/minute in the case of the HVPE, and set to 1 to 30 nm/minute in the case of the MOVPE.

Al$_x$Ga$_{1-x}$N (0.5×1), and more preferably Al$_x$Ga$_{1-x}$N (0.9× 1) are suitable as the group III nitride semiconductor containing Al of the buffer layer 3. Namely, AlN layer or AlGaN layer with high Al composition is preferable as the buffer layer 3.

The surface density (number density) of the ID on the surface of the buffer layer 3 and the surface of the group III nitride semiconductor layer 4, can be measured by Convergent Beam Electron Diffraction (CBED) method using Transmission Electron Microscope (TEM) for example.

Subsequently, as shown in FIG. 1C, a group III nitride semiconductor layer 4 such as GaN is epitaxially-grown on the buffer layer 3 having ID5 on the surface. When crystal growth is carried out on the buffer layer 3 having ID5 on the surface, pits are generated on a crystal growth surface f1 of the group III nitride semiconductor layer 4 immediately above ID5 as shown in FIG. 1C in an initial stage of the crystal growth, even if the surface of the buffer layer 3 is flat. This is because the growth speed of the N-polarity (ID5) of the group III nitride semiconductor layer 4 which grows on the N-polar face 3b(ID5) of the surface of the buffer layer 3, is slower than the growth speed of the group III polarity (such as Ga-polarity).

In the growth of the group III nitride semiconductor layer such as GaN using C-plane ((0001) plane) as the surface, dislocation is propagated in the C-axis direction vertically to the surface, and therefore there is no case that dislocations meet with each other to disappear. Namely, the dislocation becomes penetration dislocation. However, in a case that ID5 exists on the surface of the buffer layer like this embodiment, the pit is generated on the crystal growth surface, and therefore if the dislocation meets a slope of the pit, a propagating direction of the dislocation is changed (in an oblique direction or in a direction parallel to the surface), and probability of meeting the dislocations is increased, to thereby reduce the dislocation. Therefore, if the group III nitride semiconductor layer 4 such as GaN is grown on the buffer layer 3 such as AlN containing ID, the dislocation density on the surface of the group III nitride semiconductor layer 4 is more reduced than a case of the buffer layer not containing ID on the surface, and the group III nitride semiconductor layer 4 having small half width value of a rocking curve of the X-ray diffraction and having excellent crystallinity can be obtained.

Specifically, the nitride semiconductor epitaxial substrate can be obtained, wherein dislocation density on the surface of the group III nitride semiconductor substrate 4 is set to $5 \times 10^9$ cm$^{-2}$ or less, and half width values on (0002) plane, (0004) plane, and (10-12) plane are respectively 300 seconds or less, 300 seconds or less, and 500 seconds or less in measurement of the rocking curve of the X-ray diffraction of the group III nitride semiconductor layer 4. Note that as measurement conditions of the half width values of the X-ray diffraction, X-ray is generated with 40 kV, 45 mA using CuKα1 in an X-ray source, and an X-ray beam is made parallel by four crystal method, and an irradiation area of the X-ray beam is squeezed to 30 μm angle by a slit.

Although the pit is formed on the crystal growth surface f1 in the initial stage of the crystal growth of the group III nitride semiconductor layer 4, the group III polarity (Ga-polarity in the GaN layer) has the growth speed faster than the growth speed of the N-polarity, and therefore the N-polar layer (ID5) is embedded in the III-polar layer, and as shown in FIG. 1C, crystal growth surfaces f2 to f5 are flattened as the growth is further advanced, and ID does not appear on the surface of the group III nitride semiconductor layer 4.

The group III nitride semiconductor layer 4 of this embodiment is the group III nitride semiconductor layer with the C-plane of group III polarity (such as Ga polarity) used for the device as the surface, and ID5 does not exist on the surface of the group III nitride semiconductor layer 4. The group III nitride semiconductor layer 4 is composed of Al$_x$Ga$_y$In$_z$N (0≤x, y, z≤1, x+y+z=1) such as GaN, AlN, InN, AlGaN, InGaN. Further, these group III nitride semiconductor layers 4 may be any one of the undoped layer, n-type layer, and p-type layer, or may be a lamination of them.

Note that even if the surface of the buffer layer has unevenness, when there is no ID present on the surface of the buffer layer, the crystal growth surface of the group III nitride semiconductor layer grown on the buffer layer becomes flat immediately, and therefore the dislocation does not meet and disappear due to formation of the pit as described above, thus making it impossible to reduce the dislocation on the surface of the group III nitride semiconductor layer, and the half width value of the rocking curve is not reduced.

In the crystal growth of the group III nitride semiconductor layer 4, it is conceivable that the density allowing the pit to occur on the crystal growth surface, corresponds to the surface density of the ID5 on the surface of the buffer layer 3. Namely, the pits (valley portions) of the number approximately corresponding to the number of the ID5 on the group III nitride semiconductor layer 4 on the buffer layer 3 having ID5, and island-shaped crystals (mountain portions grown from one or a plurality of growth stocks) of the number approximately corresponding to the number of the ID5 are generated.

As described above, the dislocation is reduced by the presence of the aforementioned islands or the slopes of the pits. Therefore, when the pit density (namely, ID density) is extremely low (for example, when the pit density is less than $1\times10^4$ cm$^{-2}$), most of the surface of the group III nitride semiconductor layer 4 in the middle of the growth is flat C-plane, thus allowing the pits to exist sparsely, and therefore the ratio of the slopes on the surface is low, and an effect of reducing the dislocation of the present invention can't be obtained. Further, when the pit density is extremely high (for example, when the pit density is larger than $1\times10^{11}$ cm$^{-2}$), the formed pit is small, and therefore the surface is flattened in a stage of a small growth thickness of the group III nitride semiconductor layer 4. In this case as well, duration of the pit is short, and therefore the effect of reducing the dislocation according to the present invention, can't be obtained.

In a case of a suitable pit density (for example, in a case of $1\times10^4$ cm$^{-2}$ or more and $1\times10^{11}$ cm$^{-2}$ or less), the slopes exist on the surface of the group III nitride semiconductor layer in the middle of the growth with a sufficient ratio, which exists for a relatively long period of time in a growth process, and therefore the dislocation density can be more reduced than conventional. Particularly, the pit density (ID density) is preferably set to $1\times10^5$ cm$^{-2}$ or more and $1\times10^{10}$ cm$^{-2}$ or less, and is further preferably set to $1\times10^6$ cm$^{-2}$ or more and $1\times10$ cm$^{-2}$ or less, for reducing the dislocation.

Further, in the nitride semiconductor epitaxial substrate 1 of this embodiment, ID5 exists on the buffer layer 3 and the group III nitride semiconductor layer 4 at the substrate 2 side, and therefore the stress of the group III nitride semiconductor layer 4 is relaxed.

There is a large difference of thermal expansion coefficient between the substrate 2 made of sapphire, etc., and the group III nitride semiconductor layer 4 made of GaN, etc. Therefore, when a temperature returns to a room temperature state after growing the group III nitride semiconductor layer 4, warp is generated in the nitride semiconductor epitaxial substrate 1, due to the difference of the thermal expansion coefficient, thus adding a compression stress on the group III nitride semiconductor layer 4. Therefore, the crack is generated on the surface of the group III nitride semiconductor layer 4 made of GaN, etc., due to the compression stress generated in the group III nitride semiconductor layer 4. When ID does not exists on the surface of the conventional buffer layer, the number of generations of cracks is suddenly increased, in a case that a thickness of the group III nitride semiconductor layer 4 made of GaN, etc., is 5 μm or more.

However, in the nitride semiconductor epitaxial substrate 1 of this embodiment, ID5 exists on the buffer layer 3 and the group III nitride semiconductor layer 4 at the substrate 2 side, and therefore a behavior such as expanding/contracting deformation during compression/tension, is changed between the group III polar crystal and the N-polar crystal, and particularly on a boundary between the group III polarity and the N-polarity, compared with a case of the group III polar crystal only. Therefore, it can be considered that the contraction of the buffer layer 3 and the group III nitride semiconductor layer 4 at the substrate 2 side caused by the compression stress is reduced, compared with the case of the group III polar crystal, and the stress near the substrate 2, being a problem particularly, can be relaxed. In the nitride semiconductor epitaxial substrate 1 of this embodiment, with ID5 existing on the buffer layer 3 and the group III nitride semiconductor layer 4 at the substrate 2 side, the nitride semiconductor epitaxial substrate without cracks on the surface of the group III nitride semiconductor layer 4 can be manufactured with good yield rate, even if the thickness of the group III nitride semiconductor layer 4 made of GaN, etc., is set to 5 μm or more.

(Nitride Semiconductor Device)

The nitride semiconductor device according to an embodiment of the present invention is the nitride semiconductor device fabricated having a device structure such as the group III nitride semiconductor layer and an electrode formed on the nitride semiconductor epitaxial substrate 1, using the aforementioned nitride semiconductor epitaxial substrate 1. In this nitride semiconductor device, the dislocation is reduced on the surface of the group III nitride semiconductor layer 4 of the nitride semiconductor epitaxial substrate 1 of this embodiment, and the half width value of the X-ray rocking curve is small. Therefore, the nitride semiconductor device with excellent characteristics can be fabricated, compared with a case of using the conventional nitride semiconductor epitaxial substrate.

Figure 2:
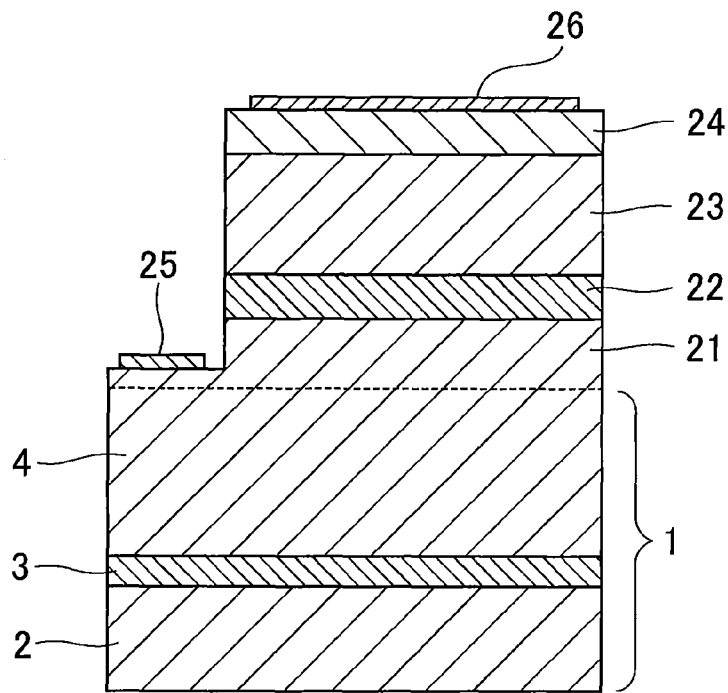
FIG. 2 is a cross-sectional view showing a nitride semiconductor device according to an embodiment of the present invention.

Blue LED (light emitting diode) shown in FIG. 2 fabricated using the nitride semiconductor epitaxial substrate of this embodiment will be described as an example of the nitride semiconductor device.

The nitride semiconductor epitaxial substrate 1 is formed by forming the GaN layer on the substrate 2, being the sapphire substrate, as the group III nitride semiconductor layer 4, via the buffer layer 2, being the AlN layer having ID. The epitaxial substrate 1 is installed on the MOVPE device, so that a laminated semiconductor having a blue LED structure is grown on the nitride semiconductor epitaxial substrate 1. The laminated semiconductor having the blue LED structure, is composed of n-type GaN clad layer 21, an active layer of InGaN/GaN multiquantum well structure, p-type AlGaN clad layer 23, and p-type GaN contact layer 24 which are sequentially laminated and grown on the group III nitride semiconductor layer 4 made of GaN.

After the aforementioned laminated semiconductor is grown, the substrate for LED is taken out from the MOVPE device, then the obtained laminated semiconductor layers of the substrate for LED are partially subjected to etching and removed by RIE (Reactive Ion Etching), to thereby expose a part of the n-type GaN clad layer 21. An n-side electrode 25 is formed on the exposed n-type GaN clad layer 21, and a p-side electrode 26 is formed on a p-type GaN contact layer 24, and thereafter chipping is conducted, to thereby fabricate the blue LED having a structure shown in FIG. 2. The LED is fabricated by using the nitride semiconductor epitaxial substrate 1 having the n-type GaN clad layer 21, the active layer 22, and the p-type AlGaN clad layer 23, on the group III nitride semiconductor layer 4 made of GaN layer with superior crystallization, and the LES thus fabricated has a large optical output and a low drive voltage.

Explanation will be given for a shottky barrier diode (SBD) as other example of the nitride semiconductor device. The nitride semiconductor epitaxial substrate using the SBD is formed by forming the GaN layer on the sapphire substrate via the buffer layer composed of the AlN layer having ID, similarly to the aforementioned LED. The SBD is fabricated by forming a schottky electrode and an ohmic electrode on an outer periphery of the shottky electrode so as to surround the shottky electrode, on the GaN layer of the nitride semiconductor epitaxial substrate, and the SBD with excellent characteristics can be obtained.

EXAMPLES

The nitride semiconductor epitaxial substrate according to an example of the present invention will be described next.

The nitride semiconductor epitaxial substrate of the example has the same cross-sectional structure as the nitride semiconductor epitaxial substrate 1 of the aforementioned embodiment shown in FIG. 1C, and the GaN layer, being the group III nitride semiconductor layer 4, is formed on the C-plane sapphire substrate (with a diameter of 4 inches), being the substrate 2, via the AlN buffer layer, being the buffer layer 3 having ID on the surface.

The AlN buffer layer had a thickness of 50 nm, containing Cl, S, or B in the AlN buffer layer as impurities, in a concentration range of approximately $1 \times 10^{15}$ cm$^{-3}$ to $1 \times 10^{20}$ cm$^{-3}$, and a plurality of AlN buffer layers with different ID surface density on the surface were formed. Then, an undoped GaN layer (with a thickness of 8 μm) was formed on the AlN buffer layer. The AlN buffer layer and the GaN layer were formed by the HVPE method. The GaN layer was grown under conditions of the growth speed: 1 μm/minute; temperature: 1050° C.; and V/III ratio: 20. A mixed gas of hydrogen and nitrogen was used as the carrier gas.

Further, the nitride semiconductor epitaxial substrate of a comparative example was fabricated, similarly to the nitride semiconductor epitaxial substrate of the aforementioned example, excluding a point that the impurities were not added into the AlN buffer layer.

The surface density of the ID on the surface of the AlN buffer layer in the nitride semiconductor epitaxial substrate of the example and the comparative example was measured by CBED method respectively. In a case that the impurity concentration in the AlN buffer layer was $1 \times 10^{19}$ cm$^{-3}$ or less in the example, ID exists on the surface of the AlN buffer layer with a surface density of $1 \times 10^{4}$ cm$^{-2}$ to $1 \times 10^{11}$ cm$^{-2}$. Meanwhile, in a case that the impurity concentration in the AlN buffer layer was larger than $1 \times 10^{19}$ cm$^{-3}$, the ID density was larger than $1 \times 10^{11}$ cm$^{-2}$. ID was not detected on the surface of the AlN buffer layer to which the impurities of the comparative example were not added. Further, ID was not detected on the surface of the GaN layer in the epitaxial substrate of the example and the comparative example respectively.

Figure 3:
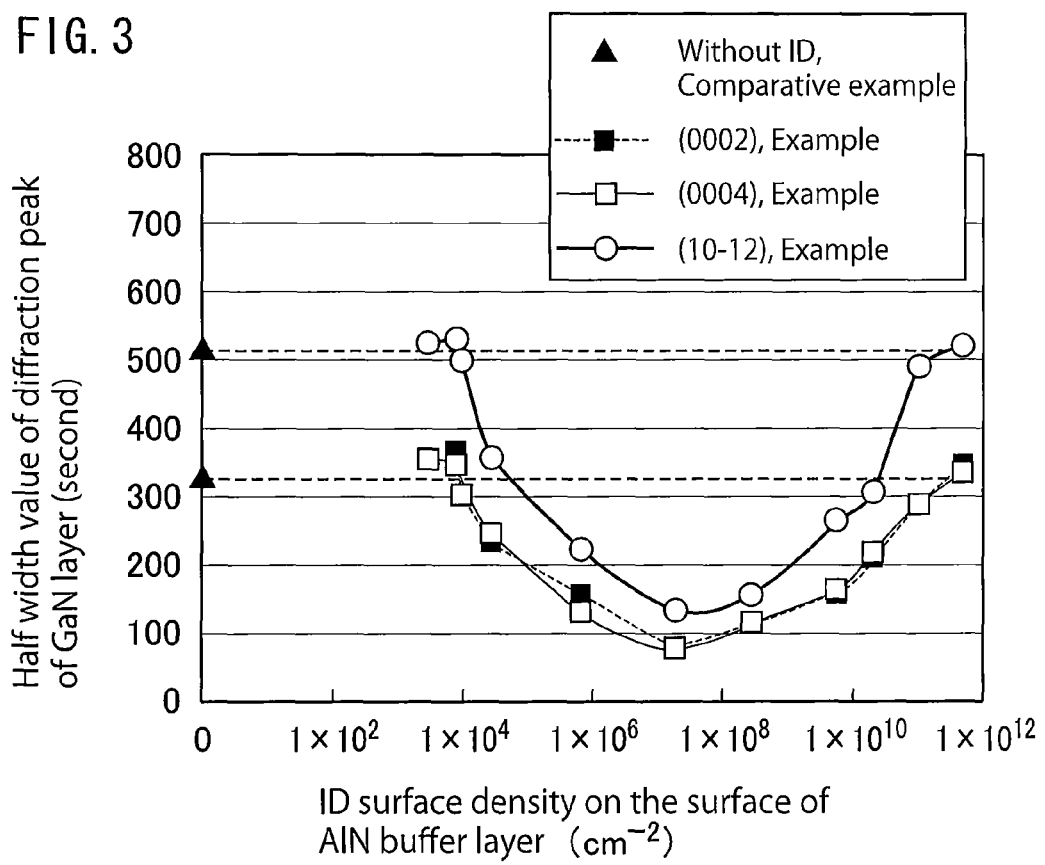
FIG. 3 is a graph showing a relation between a surface density of an inversion domain of an AlN buffer layer and a half value width of a rocking curve of X-ray diffraction of a GaN layer, in the nitride semiconductor epitaxial substrate according to an example and a comparative example of the present invention.

The X-ray diffraction was performed to the GaN layer of the epitaxial substrate of the example and the comparative example respectively, and the half width values of the rocking curves of (0002) plane, (0004) plane, and (10-12) plane were measured. FIG. 3 shows a result thereof.

As shown in FIG. 3, in the GaN layer (there is no ID on the surface of the AlN buffer layer) of the comparative example, the half width values of the rocking curves of (0002) plane and (0004) plane slightly exceeds 300 seconds in each case, and the half width value of the rocking curve of (10-12) plane exceed 500 seconds. Meanwhile, in the GaN layer, the half width values of the rocking curves of (0002) plane and (0004) plane were 300 seconds or less in each case, and the half width value of the rocking curve of the (10-12) plane was 500 seconds or less when the ID surface density on the surface of the AlN buffer layer was in a range of $1 \times 10^{4}$ cm$^{-2}$ or more and $1 \times 10^{11}$ cm$^{-2}$ or less. Further, the half width value of the rocking curve of (0002) plane and (0004) plane were 200 seconds or less in each case, and the half width value of the rocking curve of the (10-12) plane was 300 seconds or less and small when the ID surface density on the surface of the AlN buffer layer was in a range of $1 \times 10^{5}$ cm$^{-2}$ or more and $1 \times 10^{10}$ cm$^{-2}$ or less.

Figure 4:
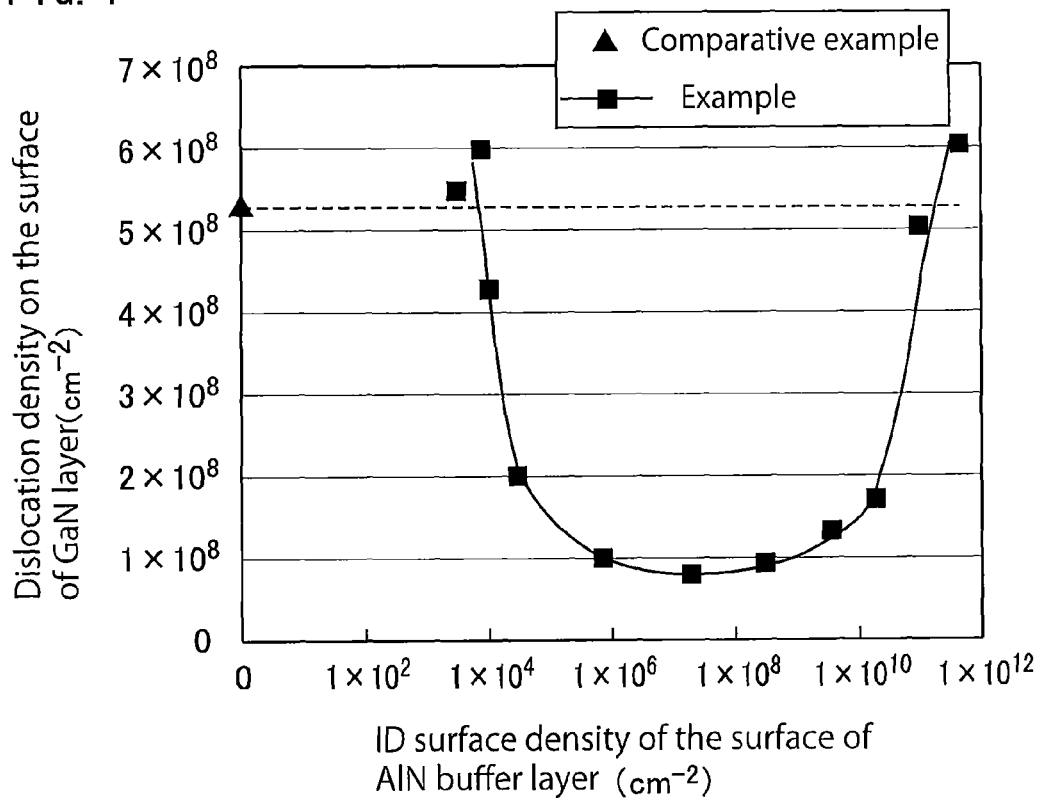
FIG. 4 is a graph showing a relation between a surface density of the inversion domain of the AlN buffer layer and a dislocation density on the surface of the GaN layer, in the nitride semiconductor epitaxial substrate according to an example and a comparative example of the present invention.

Further, the dislocation density on the surface of the GaN layer in the epitaxial substrate of the example and the comparative example was measured respectively. FIG. 4 shows a measurement result of the dislocation result.

As shown in FIG. 4, the dislocation density on the surface of the GaN layer of the comparative example exceeded $5 \times 10^{8}$ cm$^{-2}$. Meanwhile, in the GaN layer of the example, the dislocation density on the surface of the GaN layer was $5 \times 10^{8}$ cm$^{-2}$ or less when the ID surface density on the surface of the AlN buffer layer was in a range of $1 \times 10^{4}$ cm$^{-2}$ or more and $1 \times 10^{11}$ cm$^{-2}$ or less, and further the dislocation density on the surface of the GaN layer was about $1 \times 10^{8}$ cm$^{-2}$ and low when the ID surface density on the surface of the AlN buffer layer was $1 \times 10^{-2}$-2 or more and $1 \times 10$ cm$^{-2}$ or less.

When a similar experiment as described above was performed by changing the thickness of the AlN buffer layer in a range of 10 nm or more and 300 nm or less, substantially the same result was obtained.

Further, when the similar experiment as described above was performed under the growth conditions of the GaN layer, such as the growth speed: 0.1 μm/minute to 10 μm/minute, V/III ratio: 1 to 1000, the growth temperature: 900° C. to 1100° C., $H_2/N_2$ ratio in the carrier gas: 0 to 100, substantially the same result was obtained.

Figure 5:
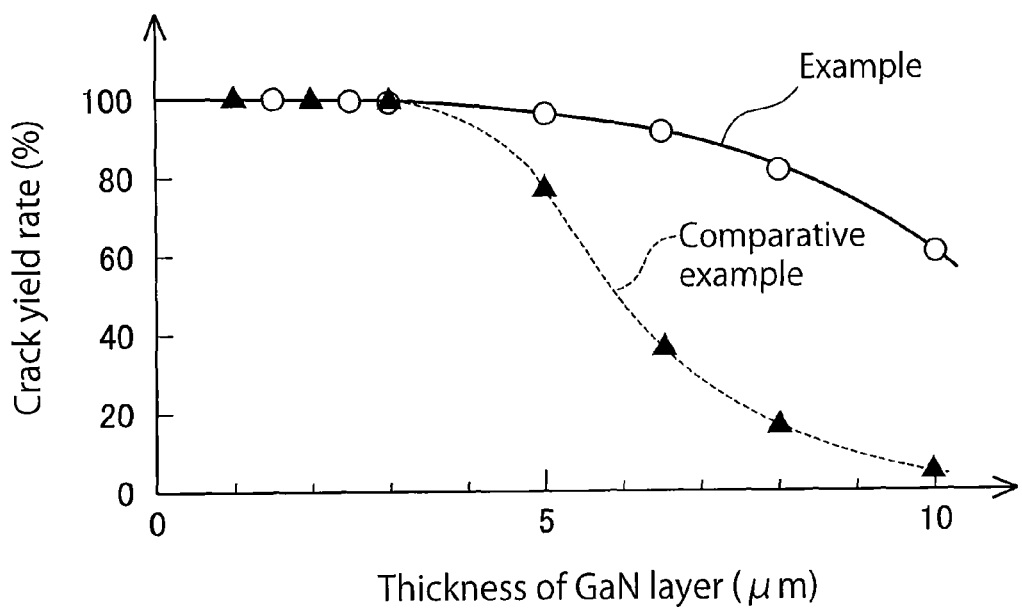
FIG. 5 is a graph showing a relation between a thickness of the GaN layer and a yield rate of cracks, in the nitride semiconductor epitaxial substrate according to an example and a comparative example of the present invention.

Next, in the nitride semiconductor epitaxial substrate of the example, various epitaxial substrates were fabricated, with the ID surface density on the surface of the AlN buffer layer set to about $1 \times 10^{7}$ cm$^{-2}$, and by variously changing the thickness of the GaN layer in a range of about 1 μm to 10 μm. Further, in the nitride semiconductor epitaxial substrate of the comparative example as well, the epitaxial substrate was fabricated by variously changing the thickness of the GaN layer. In these nitride semiconductor epitaxial substrates of the example and the comparative example, presence/absence of the generation of the crack on the surface of the GaN layer was examined. FIG. 5 shows a relation between the thickness of the GaN layer and the yield rate of the crack (the ratio (%) of not generating the crack on the GaN layer).

As shown in FIG. 5, the crack was not generated on the surface of the GaN layer up to about 3 μm of the thickness of the GaN layer in both of the epitaxial substrate of the comparative example and the epitaxial substrate of the example, and the crack yield rate was approximately 100%. However, in the epitaxial substrate of the comparative example, the crack yield rate was suddenly reduced when the thickness of the GaN layer was approximately 5 μm or more. Meanwhile, in the epitaxial substrate of the example, reduction of the crack yield rate was small even if the thickness of the GaN layer exceeded 5 μm, and when the thickness of the GaN layer was 10μ as well, there was a crack yield rate of about 60%.

When a similar experiment was performed to various AlN buffer layers with the ID surface density in a range of $1 \times 10^{4}$ cm$^{-2}$ to $1 \times 10^{11}$ cm$^{-2}$, substantially the same result was obtained.

From the results described above, it was found that the half width value of the rocking curve of the GaN layer could be made small, and the dislocation density on the surface (outermost surface) of the GaN layer could be reduced and the generation of the crack on the GaN layer could be suppressed even in a case that the thickness of the GaN layer was 5 µm or more, by containing the impurities such as Cl in the AlN buffer layer with a concentration of about $1 \times 10^{15}$ cm$^{-3}$ to $1 \times 10^{19}$ cm$^{-3}$, and by making ID exist on the surface of the AlN buffer layer with a surface density of $1 \times 10^{4}$ cm$^{-2}$ to $1 \times 10^{11}$ cm$^{-2}$.

What is claimed is:

1. A method of manufacturing a nitride semiconductor epitaxial substrate, comprising:

growing a buffer layer on a substrate; and growing a group III nitride semiconductor layer on the buffer layer, wherein in the growing the buffer layer, a layer composed of a group III nitride semiconductor containing Al and having an inversion domain on a surface, is formed by a vapor phase epitaxial method, and wherein in the growing the group III nitride semiconductor layer, a layer formed by embedding a layer grown on the inversion domain by a layer grown on a region other than the inversion domain with C-plane as a surface, is formed by a vapor phase epitaxial method.

2. The method of manufacturing a nitride semiconductor epitaxial substrate according to claim 1, wherein in the growing the buffer layer, the buffer layer is grown so that a surface density of the inversion domain that exists on the surface is in a range of $1 \times 10^{4}$ cm$^{-2}$ or more and $1 \times 10^{11}$ cm$^{-2}$ or less.

3. The method of manufacturing a nitride semiconductor epitaxial substrate according to claim 1, wherein in the growing the buffer layer, a layer composed of $Al_xGa_{1-x}N(0.5 \leq x \leq 1)$ is grown as the buffer layer.

4. The method of manufacturing a nitride semiconductor epitaxial substrate according to claim 1, wherein in the growing the buffer layer, the buffer layer is formed by HVPE method, and in the growing the group III nitride semiconductor layer, the group III nitride semiconductor layer is formed by HVPE method.

* * * * *